United States Patent [19]

Moon

[11] Patent Number: 4,731,877

[45] Date of Patent: Mar. 15, 1988

[54] TUNABLE LOWPASS-HIGHPASS SWITCHING FILTER

[75] Inventor: Fredrick H. Moon, Seoul, Rep. of Korea

[73] Assignee: Samsung Electronic Parts Co., Ltd., Suweon, Rep. of Korea

[21] Appl. No.: 869,385

[22] Filed: May 29, 1986

[30] Foreign Application Priority Data

May 31, 1985 [KR] Rep. of Korea ...................... 85-3791

[51] Int. Cl.⁴ .............................................. H04N 1/16
[52] U.S. Cl. .................................... 455/340; 455/188; 455/190
[58] Field of Search ................. 455/131, 180, 188–191, 455/284, 307, 315, 339, 340; 333/103

[56] References Cited

U.S. PATENT DOCUMENTS

| | | | |
|---|---|---|---|
| 4,247,953 | 1/1981 | Shinagawa et al. | 455/180 |
| 4,361,909 | 11/1982 | Theriault | 455/340 |
| 4,480,338 | 10/1984 | Dobrovolny | 455/340 |

*Primary Examiner*—Michael A. Masinick
*Attorney, Agent, or Firm*—Blakely, Sokoloff, Taylor & Zafman

[57] ABSTRACT

A filter is used for multichannel communication receiver, e, g, a CATV converter, which is electronically switched for a lowpass or highpass configuration by switching diodes, and the rejection bandwidth is further controlled by varactor diodes depending on the receiving channel frequency. This reduces the modulation distortions such as composite second and third order inter-modulation and cross-modulation by limiting the number of channels processed by the receiver.

2 Claims, 16 Drawing Figures

TUNABLE LOWPASS-HIGHPASS SWITCHING FILTER

BACKGROUND OF THE INVENTION

The present invention relates generally to multichannel receivers and is specifically directed to a signal converter particularly adapted for use in a large bandwidth cable television (CATV) system.

The number of channels CATV utilizes has greatly increased in the last few years and the frequency bandwidth for CATV has expanded from 300 MHz (35 channel capacity) to 440 MHz (60 channel capacity), 550 MHz (78 channel capacity) and an expansion even to 650 MHz (94 channel capacity) is contemplated. These extra channels afforded the benefit of greatly increased programming variety and generated greater revenue for the system. However, this expanded system bandwidth increased the number of interference causing channels significantly and increased also the modulation distortions correspondingly in the signal receiver and degraded the signal reception.

As the number of CATV channels kept increasing, the predominant modulation distortion has been changed from the cross-modulation to composite third order inter-modulation and then to the composite second order inter-modulations.

These modulation distortions are produced by nonlinear circuit elements which either transfer the modulation of the non-receiving channel carriers to the desired signal carrier or develop spurious beat products that stack onto the desired signal carrier in a communication receiver when the broadcast signals are evenly spaced which are characterized as the composite triple beats (CTB) or develop spurious beat products, called the composite second order beats (CSB), that stack near the desired signal carrier.

When the frequency bandwidth of the CATV system increased over 500 MHz, the predominant modulation distortion was found to be the composite second order inter-modulation. The second order beats formed by the summation of offending carrier frequencies fall 1.25 MHz above a victim video carrier frequency in the CATV system as shown in FIG. 1A. For the victim Channel 78 carrier frequency of 547.25 MHz as an example, one combination of the two offending carrier frequencies is 55.25 MHz (Ch 2) and 493.25 MHz (Ch 78) and other combinations include any two channel carrier frequencies which add to 548.5 MHz and there are 33 combinations to produce such second order beats for Channel 78. As is clearly shown in FIG. 1A, always one of two such offending channel carrier frequencies are located at lower half of the signal frequency spectrum and a highpass filter with a rejection band attenuation for the lower half spectrum of the signal frequency band will drastically reduce this type of CSB.

The second order beats formed by the difference of two offending carrier frequencies fall 0.75 MHz above a victim video carrier frequency as shown in FIG. 1B for Ch 6 in CATV system. For the victim Ch 6 carrier frequency 83.25 MHz as an example, one combination of the two offending carrier frequencies is 547.25 MHz (Ch 78) and 463.25 MHz (Ch 64) and other combinations include any two channel carrier frequencies which differ by 84 MHz and there are 69 combinations to produce such second order beats for Channel 6. As is clearly shown in FIG. 1B, at least half of two such offending carrier frequencies are located in the upper half of the signal frequency band spectrum and such CSB can be drastically reduced if a low-pass filter with a rejection band attenuation at least for the lower half of the signal frequency band. However, when the signal frequency bandwidth if substantially increased, a simple lowpass or highpass switched filter is inadequate to reduce these composite second order beats sufficiently since in such case the rejection band it required to cover more than half of the signal frequency spectrum and with sufficient rejection attenuation.

Prior art attempts to reduce these distortions have included lowpass-highpass electronic switch such as shown in FIG. 2 and FIG. 3 and also in U.S. Pat. Nos. 4,247,953 to Shinegawa et al, 4,480,338 to Pierr Dobrovolny and the tunable band reject filter extensively used in double conversion type CATV converter shown in FIG. 4. And other include developing more linear receiver components and offsetting channel carrier frequencies to place CSB beats where it is less sensitive to a victim channel. However, these attempts had a limited improvements or were not possible where the receiver is designed for an existing broadcasting medium.

The lowpass-highpass electronically switched filters shown in FIGS. 2 and 3 both essentially possess a fixed pass band and rejection band bandwidth while the circuit in FIG. 3 provides somewhat improved rejection attenuation for the lowpass filter operation. For these filters, the rejection bandwidth is less than half of the signal frequency band and its overall rejection attenuation also is limited due to a rather slow roll-off near the cut-off frequency.

The tunable band rejection filter shown in FIG. 4 is extensisvely used in the CATV double conversion tuner which is tuned by one or two variable capacitance diodes in the filter. These variable capacitance diodes in the filter are controlled with the bias voltage for the voltage controlled first oscillator. And due to the limited tuning range of the variable capacitance diodes in the filter, the tunable rejection band is limited to a rather narrow band located in the high side of the receiver signal frequncy band. Since the rejection band is always for the high side of the frequency band and the filter operates essentially as a lowpass filter, it provides protection against the composite second order beats only for the channels in the low side of the signal frequency band and does not provide any protection at all for the channels in the high side of the signal frequency band where the composite second order beat distortion is usually most severe.

It is accordingly a basic object of the present invention to provide an improved technique for reducing these modulation distortions especially the composite second order beat distortion in a multichannel communication reciever.

It is further object of the invention to provide an effective filtering circuit for reducing these modulation distortions by operating the filter in a lowpass or highpass mode and also in a variable band rejection mode extending the rejection bandwidth with variable capacitance diodes.

It is yet a further object to provide a filtering circuit with a minimum number of circuit elements to achieve effective filtering as those of Elliptic lowpass or highpass filter and whose rejection band is varied and extended for optimum rejection band attenuations.

BRIEF DESCRIPTION OF THE DRAWINGS

The appended claims set forth those novel features believed characteristic of the invention. However, the invention itself, as well as further objects and advantages thereof, will best be understood with reference to the following detailed description of a preferred embodiment taken in conjunction with the accompanying drawings, wherein like reference numerals identify like elements, in which:

DESCRIPTION OF PREFERRED EMBODIMENT

Figure 1A:
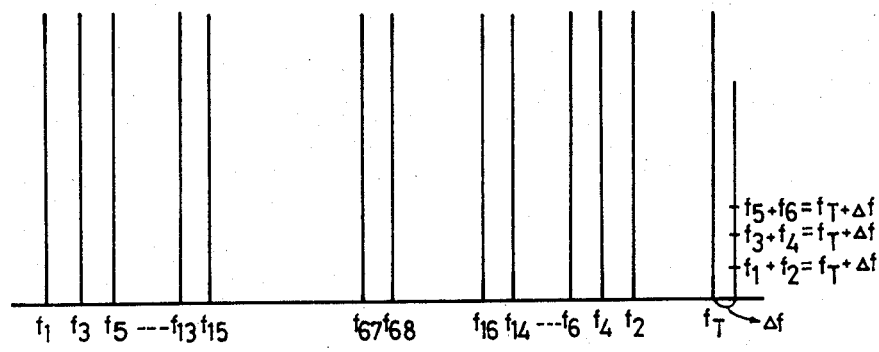
FIG. 1A-1B are graphical illustrations of the sum and difference second order inter-modulation build-up respectively on a communication receiver processing multichannel signals such as in the CATV system.
Figure 1B:
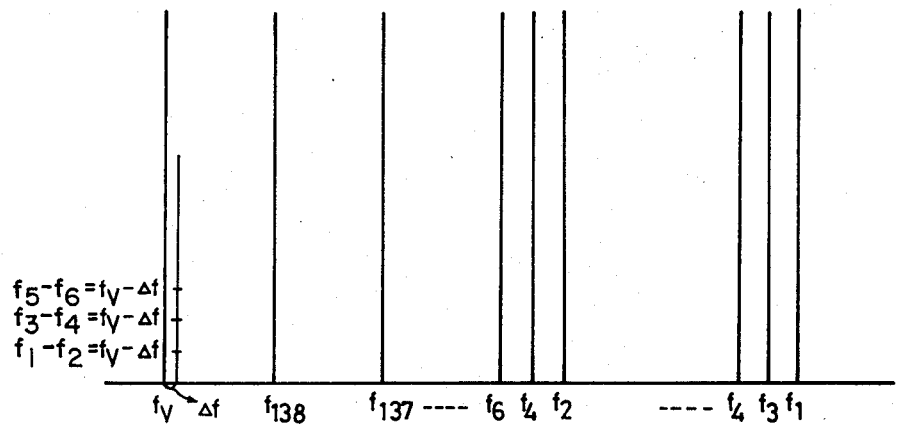
Figure 2:
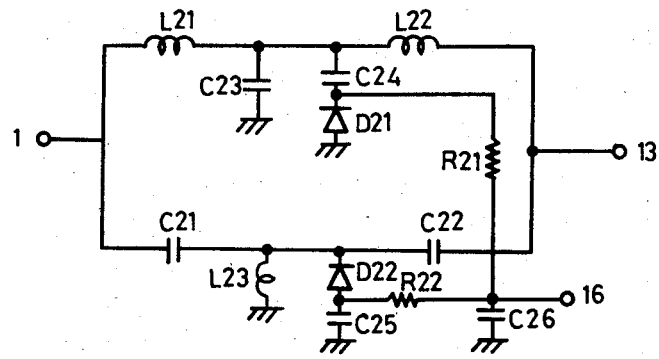
FIG. 2 is the circuit diagram of a switched lowpass-highpass filter shown in U.S. Pat. No. 4,247,953 to Shinegawa et al.
Figure 3:
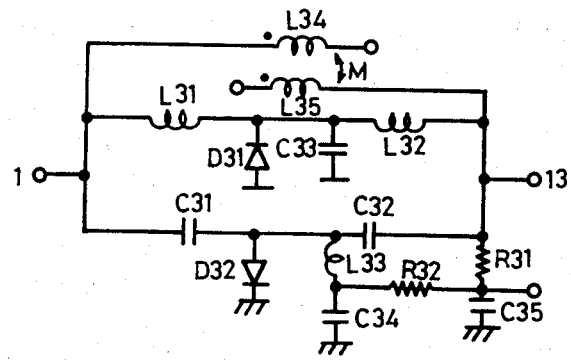
FIG. 3 is the circuit diagram of a switched lowpass-highpass filter shown in U.S. Pat. No. 4,480,338 to Dobrovolny.
Figure 4:
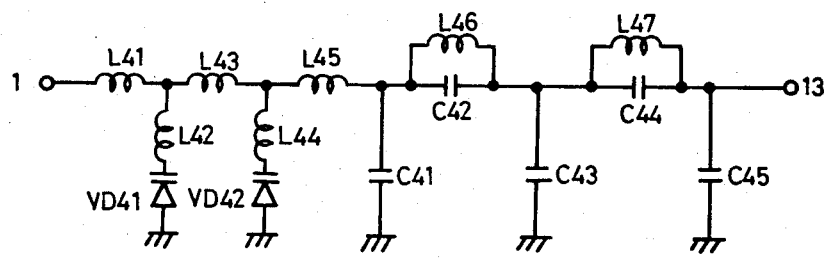
FIG. 4 is the circuit diagram of a tunable band rejection filter used in a CATV double conversion tuner.
Figure 5:
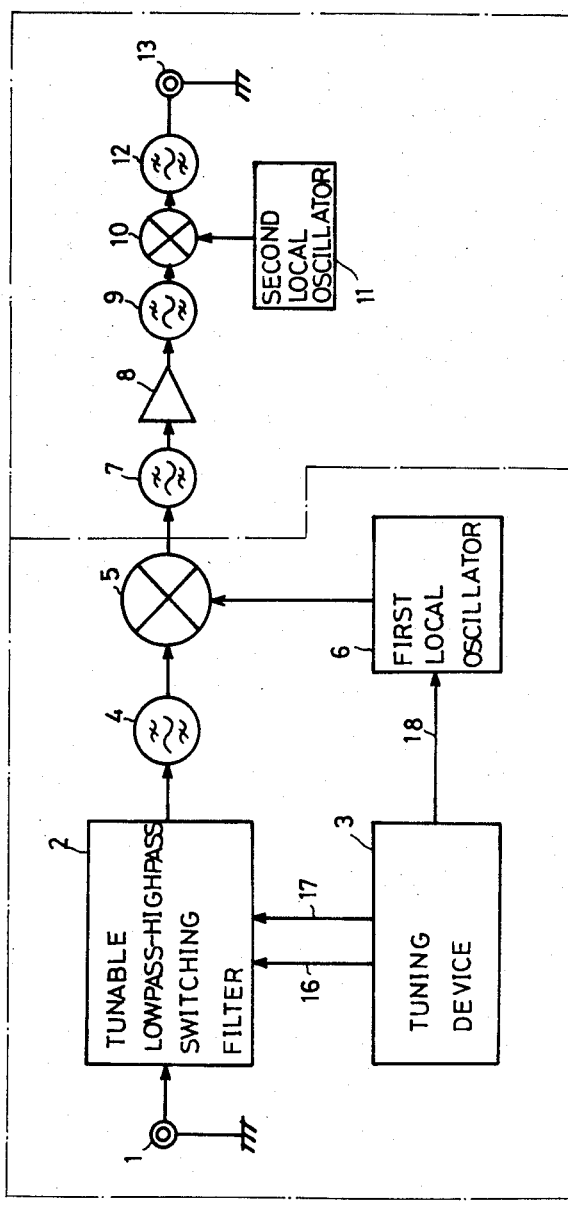
FIG. 5 is a block diagram of one embodiment of a multichannel communication receiver constructed according to the present invention.

While the tunable lowpass-highpass switching filter may be used in any multichannel receivers, the filter was invented first for use in a multichannel CATV receiver. And a double conversion arrangement of the type frequently employed in a multichannel CATV or TV receiver is illustrated for exemplary purposes and should not be taken as imposing any limitations on the invention.

The CATV receiver includes an up-converter portion 14 for translating the received RF signal to a higher intermediate frequency(IF) and a down-converter portion 15 for receiving and translating to a lower intermediate frequency(IF) output of the up-converter portion of 14.

More specifically, the receiver comprises an input terminal 1 developing signals broadcast over a plurality of CATV channels. In CATV transmission systems of a frequency spectrum between 50 to 550 MHz, up to 77 channels may be provided where each channel includes a signal carrier spaced one from the next by 6 MHz. The received signals developed at input terminal 1 in response to the transmitted carriers of all the broadcast channels are coupled through a tunable lowpass-highpass switching filter 2 which passes only a limited number of the signal channels including the tuned channel thereby significantly reducing the number of the channels reaching the first mixer 5 and reduce the modulation distortions and through lowpass filter 4 which prevents undesired signals or spurious, above the signal frequency band, emanating or reaching the first mixer 5. A tuning device 3 is operative for developing a first control signal on the output line 18, representing a channel tuned for viewing, and on the output line 17 for operating the tunable circuit portion of the tunable lowpass-highpass switching filter and for developing the second control signal on the output line 16 representing a band of channels encompassing the selected channels.

The first control signal developed on the output line 18 of tuning device 3 is coupled to a voltage controlled variable frequency first local oscillator 6 which, in response thereto, applies an appropriate local oscillator signal to a channel is converted to a first predetermined intermediate frequency(IF) signal. This first IF signal is amplified by a first IF stage consisted of input bandpass filter 7, output bandpass filter 9 and an amplifier 8, and then coupled to an input of a second mixer 10. The second mixer 10, in response to a fixed frequency second local oscillator 11, converts the first IF signal to a second predetermined IF signal. The second IF signal is processed by the output bandpass filter 12, tuned to the second predetermined IF frequency, whose IF signal processing circuit (not shown) for the processing of the IF output signal or coupled to the antenna terminals of a conventional receiver for viewing.

If the tunable switched filter was not provided at the input of the first mixer 4, all of the signal carriers would be directly coupled to the input of the first mixer 4. Since mixer 4 is inherently a non-linear device the mixer usually introduces most of the non-linear distortion in the signal path. Especially most of the inter-modulation distortions are produced at the first mixer since this is the only stage in the converter where all of the signal carriers are equally present. In accordance with the present invention, this distortion is reduced by providing tunable switching filter 2 at the input of mixer 4.

Figure 7A:
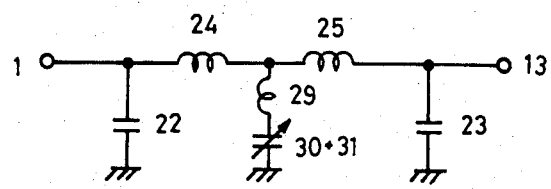
FIG. 7A-7B are electrical schematic diagrams illustrating equivalent circuits of the tunable lowpass-highpass switching filters in the switched lowpass filter mode.
Figure 7B:
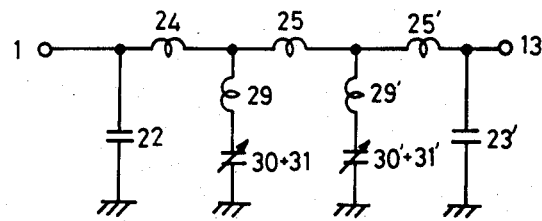
Figure 8A:
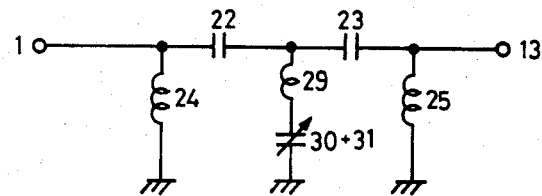
FIG. 8A-8B are electrical schematic diagrams illustrating equivalent circuits of the tunable low-pass-highpass switching filters in the highpass filter mode.
Figure 8B:
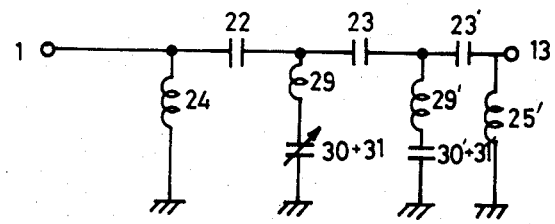

In a preferred embodiment of the invention, tunable switch filter is responsive to the second control signal developed on the output line 16 of FIGS. 7A or 7B or highpass filter mode as illustrated in FIGS. 8A or 8B. The tunable switch filter is responsive also to the first control signal developed on the output line 17 of tuning device 3 for operating the tunable rejection band circuit element and obtaining wider rejection bandwidths than that obtainable with fixed band switching filters.

Figure 9A:
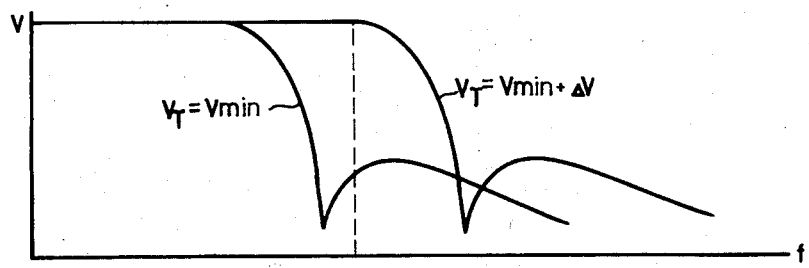
FIG. 9A-9B and 10A-10B are the graphical illustrations of the selectivity characteristics of the tunable lowpass-highpass switching filters in the lowpass filter mode at two different tuning basis voltages.
Figure 9B:
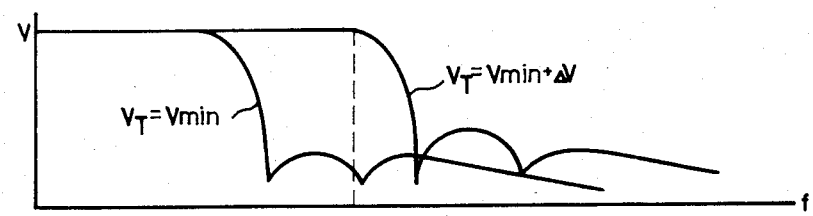
Figure 10A:
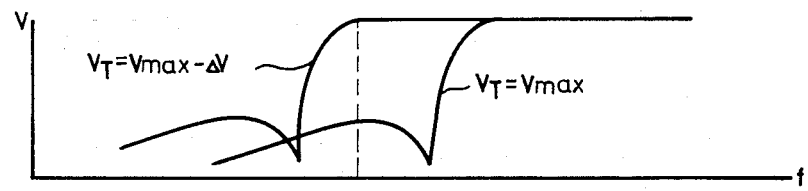
Figure 10B:
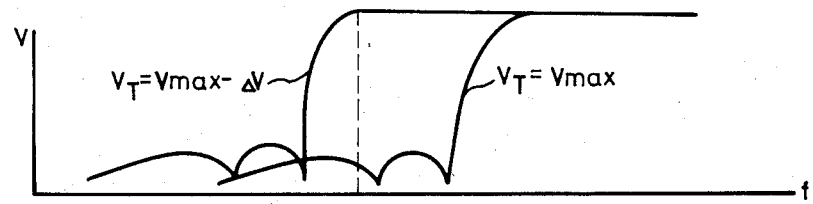

Thus, assuming that tuning device 3 tunes for a channel within the lowpass band for viewing, a control signal is developed on the output line 16 causing tuning device 2 to assume its lowpass filter operation as illustrated in FIGS. 7A or 7B depending on the signal frequency bandwidth being 550 MHz or 650 MHz. Furthermore, another control signal is developed on line 17 for tuning the rejection band circuit element in the filter to assume the overall lowpass filter characteristics as illustrated in FIGS. 9A or 9B with a wider rejection bandwidth than that obtainable with a fixed band switched filter. The channels within the pass band, including the tuned channel, are consequently passed through a fix tuned lowpass filter 4 and to the first mixer 5 where they are mixed with the output of the first local oscillator 6. For most of the tuned channels, the signal levels of more than half of the offending channel carrier signals are drastically reduced before the signals are reached to the first mixer 5 and thereby the composite second order inter-modulation distortion is in a similar manner, if tuning device 3 selects a channel within the highpass band for viewing, a control signal is developed on the output line 16 causing tuning device 2 to assume its highpass operation as illustrated in FIGS. 8A or 8B depending on the signal frequency bandwidth being 550 MHz or 650 MHz. Furthermore, another control signal is developed on line 17 for tuning the rejection band circuit element in the filter to sum the overall highpass filter characteristics as illustrated in FIGS. 10A or 10B with a wider rejection bandwidth than that obtainable with a fixed band switched filter. The channels within the pass band, including the tuned channel, are consequently passed through a fix tuned lowpass filter 4 and to the first mixer 5 where they are mixed with the output of the first local oscillator 6. For most of the tuned channels, the signal levels of more than half of the offending channel carrier signals are drastically reduced before the signals are reached to the first mixer 5 and thereby the composite second order inter-modulation distortion is significantly reduced.

Figure 6A:
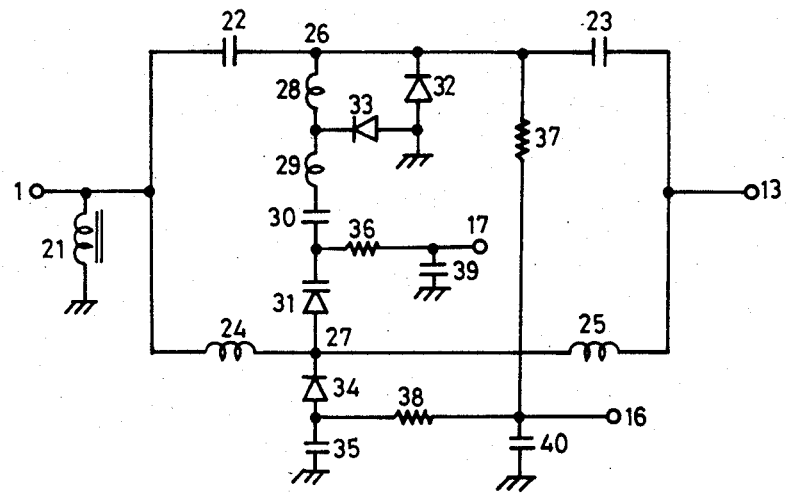
FIG. 6A-6B are electrical schematic diagrams illustrating two preferred embodiments of the tunable lowpass-highpass switching filter.
Figure 6B:
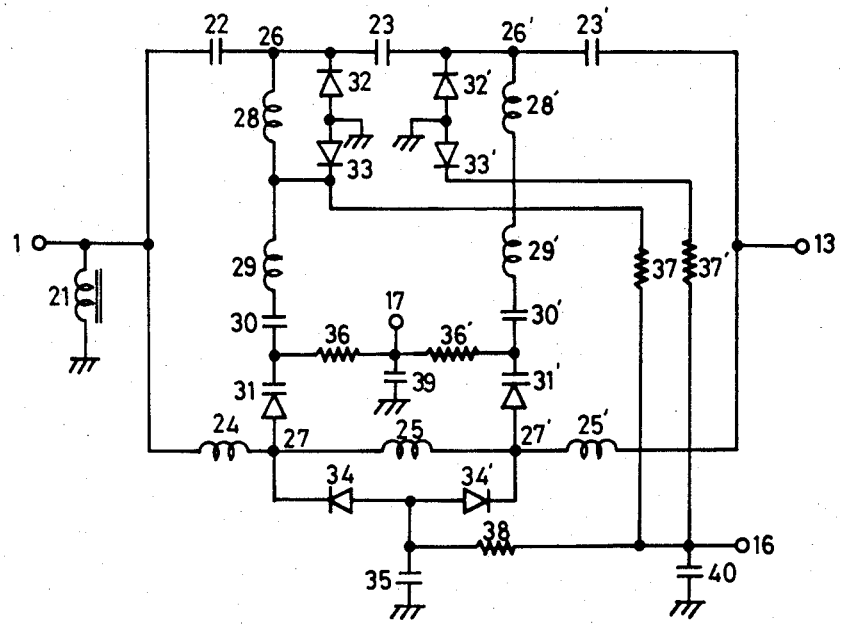

FIGS. 6A and 6B illustrates a preferred embodiment of the tunable lowpass-highpass switching filter 2. The circuit shown in FIG. 6A is a simpler version for 550 MHz signal frequency band and that shown in FIG. 6B is a more complex filter with a still wider rejection bandwidth required for wider 650 MHz signal frequency band.

The filter shown in FIG. 6A includes an input terminal 1 and a RF choke 21 which provides a ground potential voltage reference for biasing switching diode 34 and variable capacitance diode 31. A first circuit branch comprises a pair of capacitors 22 and 23 connected between input terminal 1 and output terminal 13. A second circuit branch parallel to the first circuit branch comprises a pair of series connected inductors 24 and 25 also connected between input terminal 1 and output terminal 13. A third circuit branch comprises a pair of inductors 28 and 29, a capacitor 30 and a variable capacitance diode 31 all connected in series and connected between node 26 which is the common junction between capacitors 22 and 23 and node 27 which the common junction between inductors 24 and 25. Cathode of first switching diode 32 is connected to the node 26 and its anode to the ground potential and cathode of the second switching diode 33 is connected to the common junction of inductor 28 and 29 and its anode to the ground potential. Cathode of third switching diode 34 is connected to the common junction of inductor 24 and 25 and its anode to ground potential by a bypass capacitor 35. Anode of a variable capacitance diode 31 is connected to the common junction of inductor 24 and 25 and its cathode is connected to the bias resistor 36 which is connected to ground potential by a bypass capacitor 39. Switching diode 32 and 33 are biased by a resistor 37 which is connected between the node 26 and a bypass capacitor 40 and switching diode 34 is biased by a resistor 38 which is connected between its anode and a bypass capacitor 40.

In accordance with an aspect of the present invention, switching of the tunable switching filter 2 between its lowpass and highpass configurations is accomplished by only three switching diodes 32, 33 and 34. And the tunable rejection band is accomplished with only one variable capacitance diode 31 which is in series with the inductor 28 and 29.

In order to operate the tunable switching filter 2 in a lowpass filter mode, whose circuit diagram is shown in FIG. 6A, a control signal on output line 16 of the tuning device 3 is coupled to terminal 16 of the filter and is caused to assume a negative potential rendering switching diodes 32 and 33 conductive causing the common junction of capacitors 22 and 23 at the node 26 to be connected to the ground potential and switching diode 34 non-conductive causing inductor 24 and 25 to form a series circuit branch. And a control signal on output line 17 of tuning device 3 is coupled to terminal 17 in order to bias variable capacitance diodes 31 and vary the trap frequency of an Elliptic-Function lowpass filter. The frequency of the trap is determined by the capacitance of the variable capacitance diode 31 and inductor 29 only since inductor 28 has been taken out of the series resonant branch circuit by switching diodes 32 and 33. Capacitor 30 is a dc blocking capacitor which isolates bias potentials of variable capacitance diode 31 and switching diodes 32 and 33. Thus an equivalent circuit for the lowpass filter mode as shown in FIG. 7A is obtained. And as shown in FIG. 9A, a lowpass filter characteristics for the minimum tuning voltage exhibits a lowpass filter selectivity with the cut-off frequency lower than the mid frequency of the signal band, 272 MHz, resulting an extended rejection band bandwidth. As the tuning voltage increases for the higher channels, the frequency of the trap and the cut-off frequency also increases in order to encompass the tuned higher channel in the passband as illustrated in FIG. 9A.

In order to operate the tunable switching filter 2 whose circuit diagram is shown in FIG. 6A, a control signal on output line 16 of the tuning device 3 is coupled to terminal 16 of the filter and is caused to assume a positive potential rendering switching diodes 32 and 33 non-conductive causing capacitor 22 and 23 to form a series circuit branch and switching diode 34 conductive causing the common junction of inductor 24 and 25 located at the node 27 to be connected to the ground potential. And a control signal on output line 17 of tuning device 3 is coupled to terminal 17 in order to bias variable capacitance diodes 31 and vary the trap frequency of an Elliptic-Function highpass filter. The frequency of the trap is determined by the capacitance of the variable capacitance diode 31 and inductor 28 and 29 now as inductor 29 has been added in the branch with switching diode 32 and 33 reverse biased and non-conducting. The frequency of the trap is switched into the lower half of the signal frequency band with an additional inductor 29 as the tuned channel reaches the mid frequency and the filter is switched to a highpass filter. Thus an equivalent circuit for the highpass filter mode is obtained as shown in FIG. 8A. As the tuning voltage increases further and the tuned channel frequency increases, the frequency of the trap also moves higher in frequency beyond the mid frequency of the signal frequency band resulting an extended rejection band bandwidth as illustrated in FIG. 9B.

The tunable switch filter as shown in FIG. 6B operates in the same manner as the tunable switching filter just described above and shown in FIG. 6A but with an improvement in the overall rejection band attenuation. This is achieved with an additional series resonant branch for additional trap which is consisted of three additional switching diodes, one variable capacitance diode, two inductors and associated biasing networks. The equivalent circuits of this tunable switching filter are shown in FIGS. 7B and 8B for the lowpass filter mode and highpass filter mode respectively. The resultant filter is an Elliptic-Function filter with two traps instead of one as FIG. 9B and FIG. 10B illustrate the frequency selectivity curves of this higher order tunable lowpass-highpass switching filter.

While particular embodiments of the invention have been shown and described, it will be obvious to those skilled in the art that changes and modification may be made therein without departing from the invention in its broader aspects, and therefore, the aim in the appended claims is to cover all much changes and modifications as fall within the true spirit and scope of the invention.

I claim:

1. A tunable and switchable filter for reducing intermodulation distortion levels in a multichannel communications receiver comprising:
    an input terminal for receiving signals broadcast over a plurality of communication channels;
    an output terminal;
    first and second series connected capacitors coupled between said input terminal and said output terminal;
    first and second series connected inductors coupled between said input terminal and said output terminal;
    third and fourth series connected inductors, a third capacitor and a first variable capacitance diode connected in series between the common junction of said first and second series connected inductors and the common junction of said first and second capacitors;
    first and second diodes for selectively shunting one of the common junction of said first and second capacitors and the common junction of said third and fourth inductors directly to reference ground potential, wherein said selective shunting establishes one of a lowpass and a highpass filter characteristic between said input terminal and said output terminal;
    a third diode for selectively shunting said first and second inductors directly to reference ground potential for lowering the frequency of the trap in highpass filter mode.

2. A tunable and switchable filter for reducing intermodulation distortion levels in a multichannel communications receiver comprising:
    an input terminal for receiving signals broadcast over a plurality of communications channels;
    an output terminal;
    at least two series connected capacitors coupled between said input terminal and said output terminal;
    at least two series connected inductors coupled between said input terminal and said output terminal;
    a pair of series connected inductors, a capacitor and a first variable capacitance diode coupled between the common junction of said two series connected capacitors coupled between said input terminal and said output terminal, and the common junction of said two series connected inductors coupled between said input terminal and said output terminal;
    first and second switching means for selectively shunting one of the common junction of each pair of series connected capacitors coupled between the input terminal and the output terminal, and the common junction of each corresponding pair of inductors coupled between the input terminal and the output terminal, directly to reference ground potential, wherein said selective shunting establishes one of a lowpass and a highpass filter characteristic between said input terminal and said output terminal;
    third switching means for selectively shunting the common junction of two series connected inductors coupled between said input terminal and said output terminal directly to reference ground potential for lowering the frequency of the trap in highpass filter mode.

* * * * *